US008012798B2

(12) United States Patent
Miyazaki

(10) Patent No.: US 8,012,798 B2
(45) Date of Patent: Sep. 6, 2011

(54) METHOD OF FABRICATING STACKED SEMICONDUCTOR CHIPS

(75) Inventor: Toru Miyazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/774,031

(22) Filed: May 5, 2010

(65) Prior Publication Data

US 2010/0297827 A1 Nov. 25, 2010

(30) Foreign Application Priority Data

May 22, 2009 (JP) .................................. 2009-124173

(51) Int. Cl.
*H01L 21/00* (2006.01)
*H01L 23/48* (2006.01)

(52) U.S. Cl. ........ 438/107; 438/110; 438/113; 438/458; 438/464; 257/774; 257/777; 257/E21.477; 257/E21.599

(58) Field of Classification Search .................. None
See application file for complete search history.

(56) References Cited

U.S. PATENT DOCUMENTS

| 5,122,856 A * | 6/1992 | Komiya | 257/774 |
| 6,856,026 B2 * | 2/2005 | Yamada et al. | 257/774 |
| 6,873,054 B2 * | 3/2005 | Miyazawa et al. | 257/774 |
| 2002/0047210 A1 * | 4/2002 | Yamada et al. | 257/774 |
| 2006/0177999 A1 * | 8/2006 | Hembree et al. | 438/597 |
| 2007/0048969 A1 * | 3/2007 | Kwon et al. | 438/455 |

FOREIGN PATENT DOCUMENTS

| JP | 11-163036 | 6/1999 |
| JP | 2004-006818 | 1/2004 |
| JP | 2004-363573 | 12/2004 |
| JP | 2007-180395 | 7/2007 |
| JP | 2007-311385 | 11/2007 |
| JP | 2008-251964 | 10/2008 |

* cited by examiner

*Primary Examiner* — Alonzo Chambliss
(74) *Attorney, Agent, or Firm* — Young & Thompson

(57) ABSTRACT

A method for manufacturing a semiconductor device includes forming a first opening in a substrate to expose an interconnect structure, forming a seed film on the substrate, forming a first projecting electrode buried inside the first opening protruding outward from the substrate, forming a first metal film on the first projecting electrode, attaching a first supporting substrate to the substrate with a first adhesion layer, forming a second opening in the substrate to expose the interconnect structure, forming a second projecting electrode buried inside the second opening and protruding outward from the substrate, forming a second metal film on the second projecting electrode, attaching a second supporting substrate to the substrate with a second adhesion layer, removing the first supporting substrate, the first adhesion layer, and an exposed part of the seed film, removing the second supporting substrate and the second adhesion layer, and cutting the substrate into the plurality of chips.

22 Claims, 17 Drawing Sheets

METHOD OF FABRICATING STACKED SEMICONDUCTOR CHIPS

This application is based upon and claims the benefit of priority from Japanese Patent Application No. 2009-124173, filed on May 22, 2009, the disclosure of which is incorporated herein in its entirety by reference.

BACKGROUND OF THE INVENTION

1. Field of the Invention

The present invention relates to a method for manufacturing a semiconductor device.

2. Description of the Related Art

As disclosed in JP2007-311385A, JP2004-363573A and JP2008-251964A, efforts are being made to develop a semiconductor device in which a plurality of semiconductor chips is stacked through through-hole electrodes, in order to cope with the miniaturization of electronic apparatus equipped with semiconductor chips. In such a semiconductor device, connecting terminals need to be disposed respectively at one and the other ends of each through-hole electrode to form a strong junction therebetween and fix the through-hole electrodes to one another, in order to stack a plurality of semiconductor chips.

FIGS. 13 to 16 are schematic cross-sectional views used to explain a method for manufacturing a related semiconductor device. Hereinafter, a description will be given by defining a surface in which semiconductor elements are formed as a front surface, and defining a surface opposite to the front surface as a rear surface, in a semiconductor substrate (wafer). In FIG. 13 to FIG. 16, only one through-hole electrode is shown for purposes of illustration. In addition, a part from the rear surface side of the semiconductor substrate to first interconnect layer 53 in the through-hole electrode is omitted from the figures.

First, as illustrated in FIG. 13, interlayer insulating film 52, first interconnect layer 53, and second interconnect layer 55 are formed on and above the front surface of semiconductor substrate 51. This interlayer insulating film 52 is formed of silicon dioxide ($SiO_2$) or the like. A connection is made between first interconnect layer 53 and second interconnect layer 55 by contact plug 54.

In FIG. 13, trench 64 is formed so as to surround the through-hole electrode provided in semiconductor substrate 51. An insulator, such as silicon dioxide or the like, is filled inside trench 64. This trench 64 prevents through-hole electrodes disposed in abutment with each other from short-circuiting to each other. In addition, trench 64 is previously formed on the front surface side of semiconductor substrate 51 prior to a step of forming semiconductor elements. Trench 64 need not necessarily penetrate to the rear surface of the semiconductor substrate.

Reference numeral 56 denotes a protective film formed of polyimide or the like and an opening is created therein, so as to expose part of the upper surface of second interconnect layer 55. Reference numeral 57 denotes a metal seed film provided so as to cover the upper surface of protective film 56. Metal seed film 57 is provided in order to form a projecting electrode (bump) using an electrolytic plating method. Metal seed film 57 is in contact with an exposed surface of second interconnect layer 55. Metal seed film 57 is formed using a laminated film (film thickness: approximately 700 nm) in which a titanium (Ti) film and a copper (Cu) film are successively laminated. Reference numeral 58 denotes a resist film (film thickness: 15 to 20 µm) including an opening in a position thereof where the projecting electrode is to be formed.

Next, as illustrated in FIG. 14, projecting electrode 59 made of copper is formed in the opening not covered with resist film 58 to a thickness of approximately 10 µm using an electrolytic plating method. Sn—Ag alloy film 60 made of tin (Sn) and silver (Ag) is formed on the upper surface of projecting electrode 59 to a thickness of 2 to 3 µm using an electrolytic plating method. After that, resist film 58 is removed, and then metal seed film 57 is removed using a chemical solution containing sulfuric acid ($H_2SO_4$) and nitric acid ($HNO_3$). A titanium film in which metal seed film 57 remains is removed using a chemical solution containing potassium hydroxide (KOH).

Side surfaces of projecting electrode 59 made of copper are also removed partially by etching at the time of removing this metal seed film 57, but Sn—Ag alloy film 60 is not etched. There is therefore formed an overhanging shape in which Sn—Ag alloy film 60 protrudes over an outer circumference of projecting electrode 59.

Next, as illustrated in FIG. 15, supporting substrate (support plate) 62 is bonded onto the front surface side of semiconductor substrate 51 through a adhesion layer 61. As supporting substrate 62, a transparent glass substrate or a hard resin substrate can be used. After this, the rear surface side of semiconductor substrate 51 is polished (back-grind) until a predetermined thickness is reached, thereby thinning the substrate and exposing the edges of previously-formed trench 64.

After this, a metal plug (not illustrated) made of copper is formed from the rear surface side of the semiconductor substrate, so as to connect to first interconnect layer 53. A thin-film plating layer made of gold (Au) is provided in an exposed part of the metal plug. After the formation of the metal plug, supporting substrate 62 is removed.

Supporting substrate 62 is removed by previously irradiating ultraviolet light from the front surface side and thereby reducing the fixing strength of adhesion layer 61.

As illustrated in FIG. 16, the other process may be used. In this process, an Sn—Ag alloy film may be formed on projecting electrode 59 on the front surface side. Then, this film may be completely reflowed at a temperature of approximately 250 to 300° C. Reflowed Sn—Ag alloy film 60a is reshaped into a dome-like shape due to surface tension, and the overhanging shape is thus eliminated. This process prevents projecting electrode 59 from being pulled by supporting substrate 62 and dropping off, due to an overhanging shape at the time of removing supporting substrate 62.

SUMMARY OF THE INVENTION

In one embodiment, there is provided a method for manufacturing a semiconductor device, comprising:

preparing a substrate including a plurality of chips, each of the chips comprising an interconnect structure therein, and the substrate including a first surface and a second surface opposite to the first surface;

forming a first opening from the first surface of the substrate toward a thickness direction thereof, so as to expose the interconnect structure;

forming a seed film on the first surface of the substrate;

forming a first projecting electrode, so that the first projecting electrode is buried inside the first opening in which the seed film is provided and protrudes outward from the first surface of the substrate;

forming a first metal film on an outside top surface of the first projecting electrode;

attaching a first supporting substrate to the first surface of the substrate with a first adhesion layer interposed therebetween;

forming a second opening from the second surface of the substrate toward the thickness direction thereof, so as to expose the interconnect structure;

forming a second projecting electrode, so that the second projecting electrode is buried inside the second opening and protrudes outward from the second surface of the substrate;

forming a second metal film on an outside top surface of the second projecting electrode;

attaching a second supporting substrate to the second surface of the substrate with a second adhesion layer interposed therebetween;

removing the first supporting substrate and the first adhesion layer;

removing an exposed part of the seed film provided on the first surface;

removing the second supporting substrate and the second adhesion layer; and cutting the substrate into the plurality of chips, each of the chips being provided with a through-hole electrode including the first projecting electrode, the seed film inside the first opening, the interconnect structure, and the second projecting electrode.

In another embodiment, there is provided a method for manufacturing a semiconductor device, comprising:

forming a semiconductor chip in a semiconductor substrate including a first surface and a second surface opposite to the first surface;

forming a first projecting electrode, in which a first metal film is provided as an outermost layer, over the first surface of the semiconductor chip;

attaching a supporting substrate to the first surface of the semiconductor substrate;

forming an electrode part to be electrically connected to the first projecting electrode from the second surface side;

forming a second projecting electrode, in which a second metal film is provided as an outermost layer, on an edge exposed on the second surface side of the electrode part;

removing the supporting substrate; and reflowing the first metal film by heating the semiconductor substrate after removing the supporting substrate.

BRIEF DESCRIPTION OF THE DRAWINGS

The above features and advantages of the present invention will be more apparent from the following description of certain preferred embodiments taken in conjunction with the accompanying drawings, in which.

Figure 1:
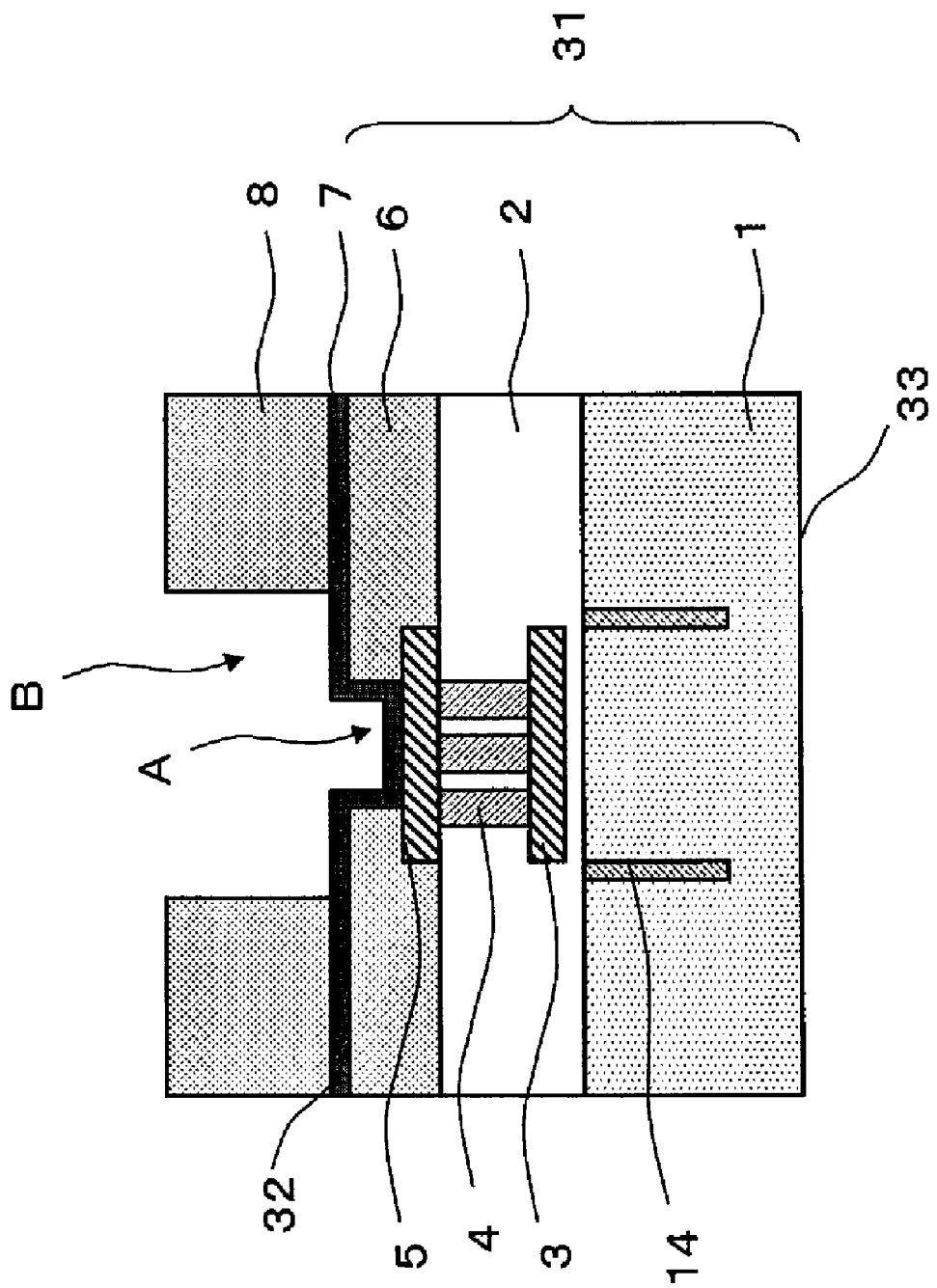
FIG. 1 is a diagram illustrating one step in one example of a method for manufacturing a semiconductor device of the present invention.

In the drawings, numerals have the following meanings: 1, 1a: semiconductor substrate, 2, 2a: interlayer insulating film, 3, 3a: first interconnect layer, 4, 4a: contact plug, 5, 5a: second interconnect layer; 6, 6a: protective film; 7, 7a: metal seed film, 8: resist film, 9, 9a: first projecting electrode, 10: Sn—Ag alloy film; 11: first adhesion layer, 12: first supporting substrate, 13, 13a: insulating film, 14, 14a: trench, 15, 15a: metal seed film, 16, 16a: copper plug, 17, 17a: Ni—Au laminated film, 18: resist film, 19: second adhesion layer, 20: second supporting substrate, 21: base substrate, 22: interface chip, 23, 24: core chip, 23a: Ni—Au laminated film, 23c: through-hole electrode, 25: attach film, 26: lead frame, 27: solder ball, 28: interconnect layer, 29: terminal, 30: resin, 31: substrate, 32: first surface, 33: second surface, 51: semiconductor substrate, 52: interlayer insulating film, 53: first interconnect layer, 54: contact plug, 55: second interconnect layer, 56: protective film, 57: metal seed film, 58: resist film, A: bottom of first opening, B: opening, and C: second opening.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In addition, a description will be given by defining a surface in which semiconductor elements are formed as a front surface, and defining a surface opposite to the front surface as a rear surface, in a semiconductor substrate (wafer). Although in the below-described exemplary embodiments, only one through-hole electrode is shown in one semiconductor chip for purposes of illustration, two or more through-hole electrodes may be present in one semiconductor chip.

In the present invention, the term "interconnect structure" refers to a structure composed of an interconnect layer, a contact plug and the like electrically connected to a semiconductor element or the like and capable of turning on an electric current. The term "first surface" refers to one surface of a substrate and the term "second surface" refers to the other surface of the substrate. The "second surface" is positioned so as to be opposite to the "first surface," with respect to the substrate.

First Exemplary Embodiment

Figure 17:
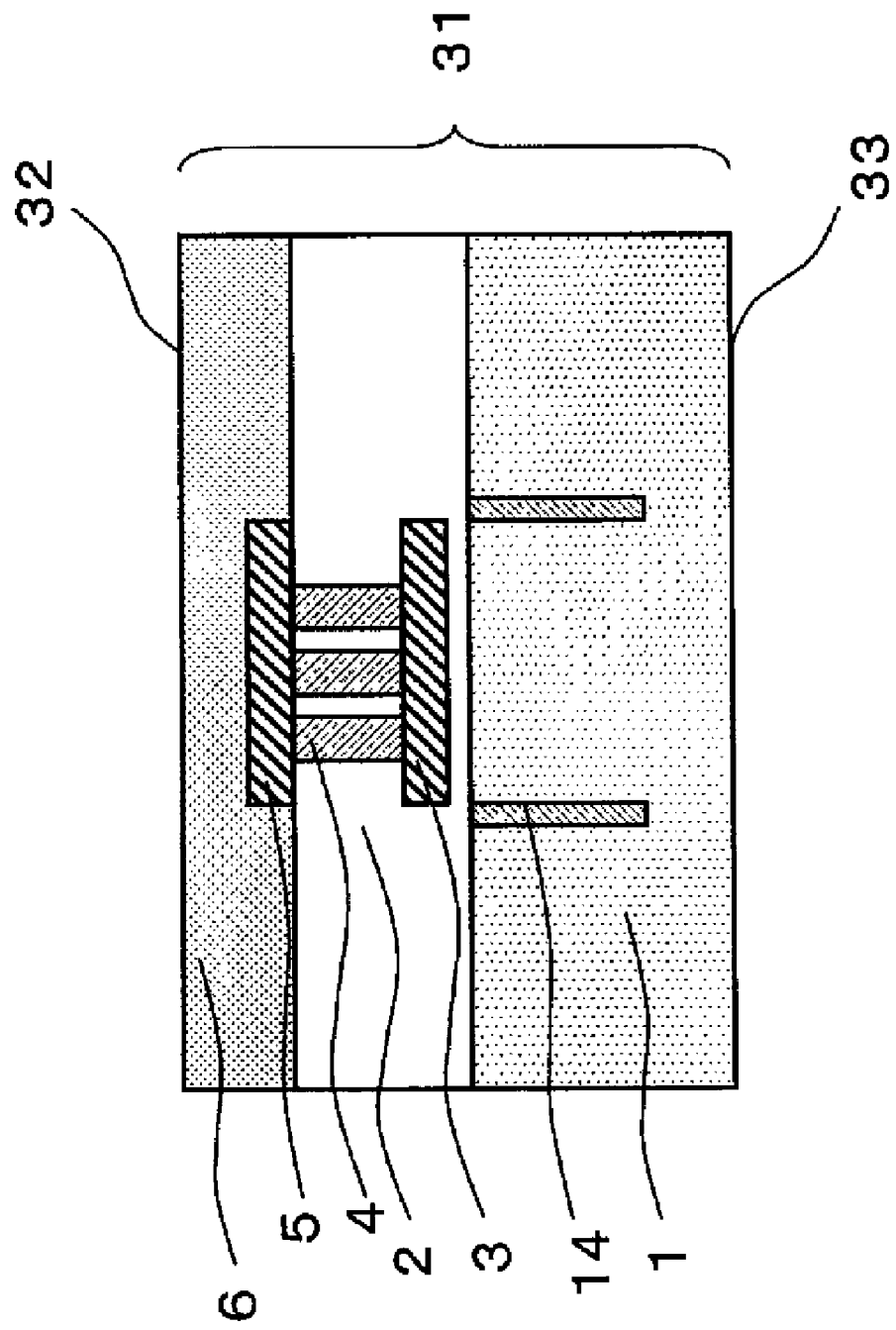
FIG. 17 is a diagram illustrating one step in one example of a method for manufacturing a semiconductor device of the present invention.

The present exemplary embodiment relates to a method for manufacturing a semiconductor device in which two semiconductor chips are stacked. First, as illustrated in FIG. 17, substrate 31 including semiconductor substrate 1 made of silicon or the like, interlayer insulating film 2, and protective film 6 is prepared. Interlayer insulating film 2, first interconnect layer 3 and second interconnect layer 5 are formed on and above the front surface of semiconductor substrate 1 made of silicon or the like. For the first interconnect layer, tungsten (W), for example, can be used. For the second interconnect layer, aluminum (Al), for example, can be used. Interlayer insulating film 2 is formed using silicon dioxide or the like. In addition, a connection is made between first interconnect layer 3 and second interconnect layer 5 by contact plug 4. The number of contact plugs and the size thereof are not limited in particular. Another interconnect layer may further be provided between first interconnect layer 3 and second interconnect layer 5. In the present exemplary embodiment, first interconnect layer 3, second interconnect layer 5 and contact plug 4 correspond to an interconnect structure. In addition, the front surface of protective film 6 corresponds to first surface 32, and a surface of semiconductor substrate 1 opposite to first surface 32 corresponds to second surface 33.

A semiconductor element (not illustrated), such as a MOS transistor, is formed on the front surface of semiconductor substrate 1 to form an intended circuit. This semiconductor element is electrically connected to first interconnect layer 3 and second interconnect layer 5. A through-hole electrode not connected to an internal circuit may be provided.

Reference numeral 14 denotes a trench formed so as to surround a through-hole electrode to be formed later. An insulator, such as silicon dioxide, is filled inside the trench. Trench 14 prevents through-hole electrodes disposed in abutment with each other from short-circuiting to each other. Trench 14 is previously formed on the front surface side of semiconductor substrate 1 prior to a step of forming the semiconductor element. Trench 14 need not necessarily penetrate to the rear surface side of the semiconductor substrate.

Reference numeral 6 denotes a protective film made of polyimide or the like. Protective film 6 may alternatively be a laminated film in which a polyimide film is provided on a silicon nitride ($Si_3N_4$) film or a silicon oxynitride (SiON) film.

As illustrated in FIG. 1, first opening A is created in protective film 6, so as to expose part of the upper surface of second interconnect layer 5. Film 7 is a metal seed film provided so as to cover the upper surface of protective film 6, and is provided across the entire surface of the first surface side (on first surface 32 and on the inner walls of first opening A). The metal seed film has contact with the upper surface of second interconnect layer 5 at the bottom of first opening A. Metal seed film 7 is provided in order to form a first projecting electrode (bump) using an electrolytic plating method. Metal seed film 7 is formed of a laminated film (film thickness: approximately 700 to 800 nm) formed by successively depositing a titanium film and a copper film using a sputtering method.

The titanium film provided in the lower layer of metal seed film 7 has the function of increasing adhesive strength between second interconnect layer 5 and the upper layer (copper film) of metal seed film 7. The upper layer (copper film) of metal seed film 7 functions as a seed for a metal to be deposited later using an electrolytic plating method.

Reference numeral 8 denotes a resist film (film thickness: 15 to 20 μm) including an opening in a position where a projecting terminal is to be formed. As resist film 8, a film-type resist film in which opening B is created using a photolithographic technique can be used.

Figure 2:
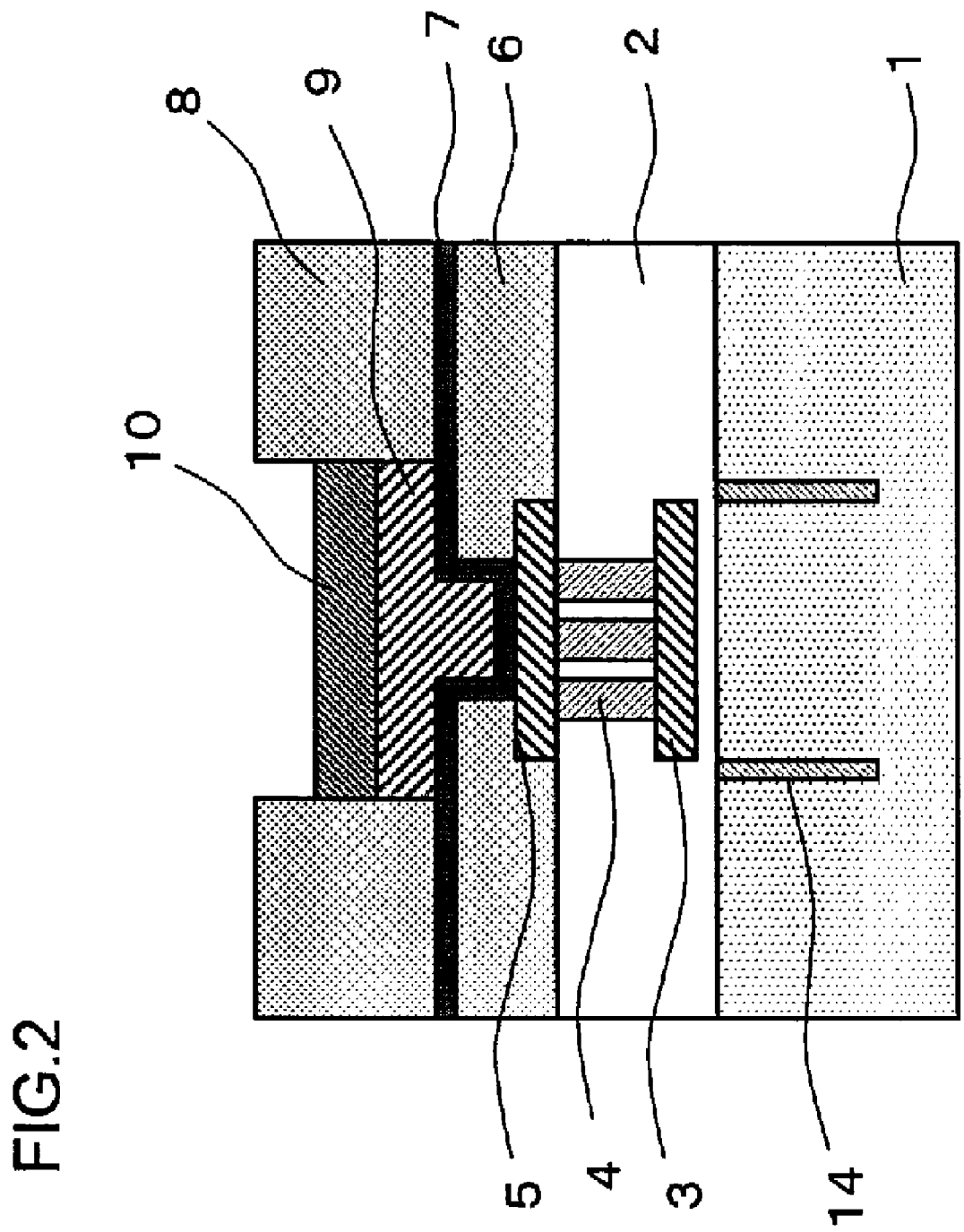
FIG. 2 is a diagram illustrating one step in one example of a method for manufacturing a semiconductor device of the present invention.

Next, as illustrated in FIG. 2, first projecting electrode (bump) 9 made of copper (Cu) is formed inside opening B not covered with resist film 8 to a thickness of approximately 10 μm, using an electrolytic plating method. Specifically, semiconductor substrate 1 is placed in a plating bath filled with a copper-containing electrolytic solution. Then, copper is deposited on metal seed layer 7 by turning on an electric current with semiconductor substrate 1 in which metal seed layer 7 is formed set as a negative electrode and another electrode provided inside the plating bath set as a positive electrode.

Subsequently, also using an electrolytic plating method, Sn—Ag alloy film 10 made of tin (Sn) and silver (Ag) is formed on the upper surface of first projecting electrode 9 to a thickness of 2 to 3 μm. The composition ratio of Sn—Ag alloy film 10 is not limited in particular. Preferably, however, the content of Ag in the alloy film is set to 1.5 to 3.5 weight % (wt %) from the viewpoint of securing temperature required at the time of reflow and preventing voids from being produced.

Figure 3:
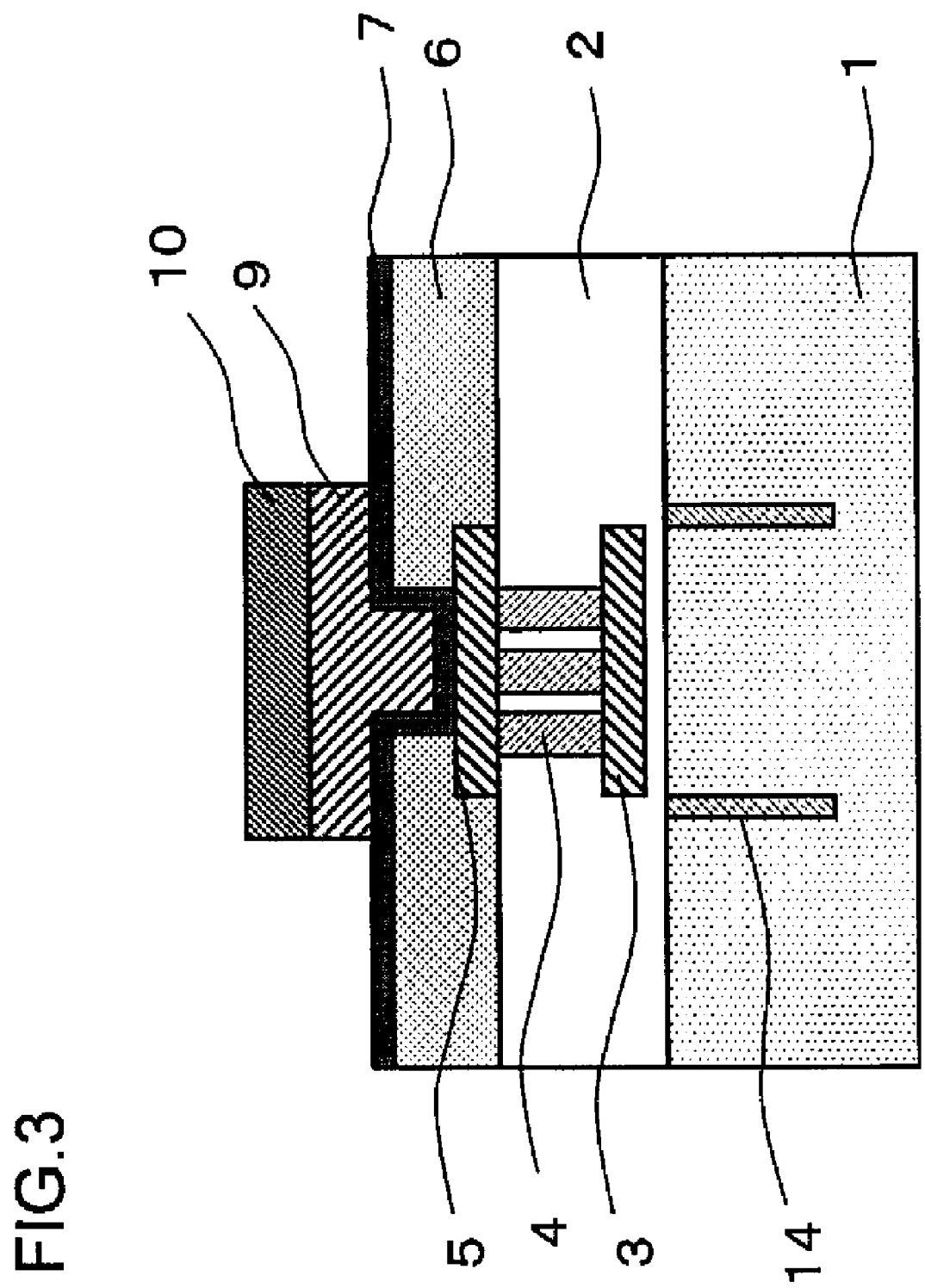
FIG. 3 is a diagram illustrating one step in one example of a method for manufacturing a semiconductor device of the present invention.

Next, as illustrated in FIG. 3, resist film 8 is removed after the formation of first projecting electrode 9 and Sn—Ag alloy film 10. In the present exemplary embodiment, metal seed film 7 is left as is at this stage without being removed. This prevents any overhanging shapes from being formed in first projecting electrode 9 along with the removal of metal seed film 7.

Figure 4:
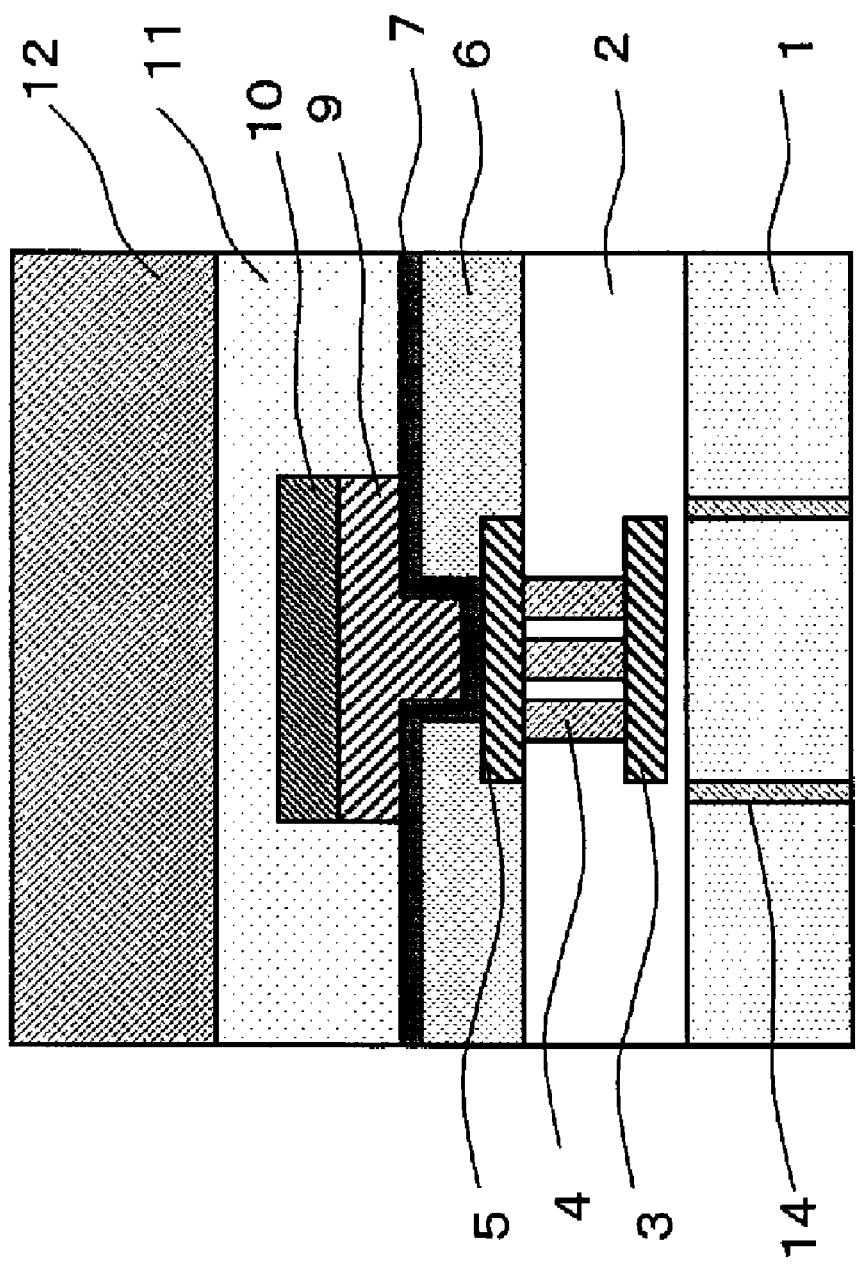
FIG. 4 is a diagram illustrating one step in one example of a method for manufacturing a semiconductor device of the present invention.

After this, as illustrated in FIG. 4, first supporting substrate (support plate) 12 is bonded through first adhesion layer 11, so as to cover the entire surface of the substrate's first surface side (exposed parts of first projecting electrode 9, Sn—Ag alloy film 10 and metal seed film 7). As first supporting substrate 12, a transparent glass substrate or a hard resin substrate can be used. After this, the rear surface side of semiconductor substrate 1 is polished (back-grind) until a predetermined thickness (approximately 40 to 100 μm) is reached, thereby thinning the substrate and exposing the edges of previously formed trench 14 on the rear surface side thereof.

Figure 5:
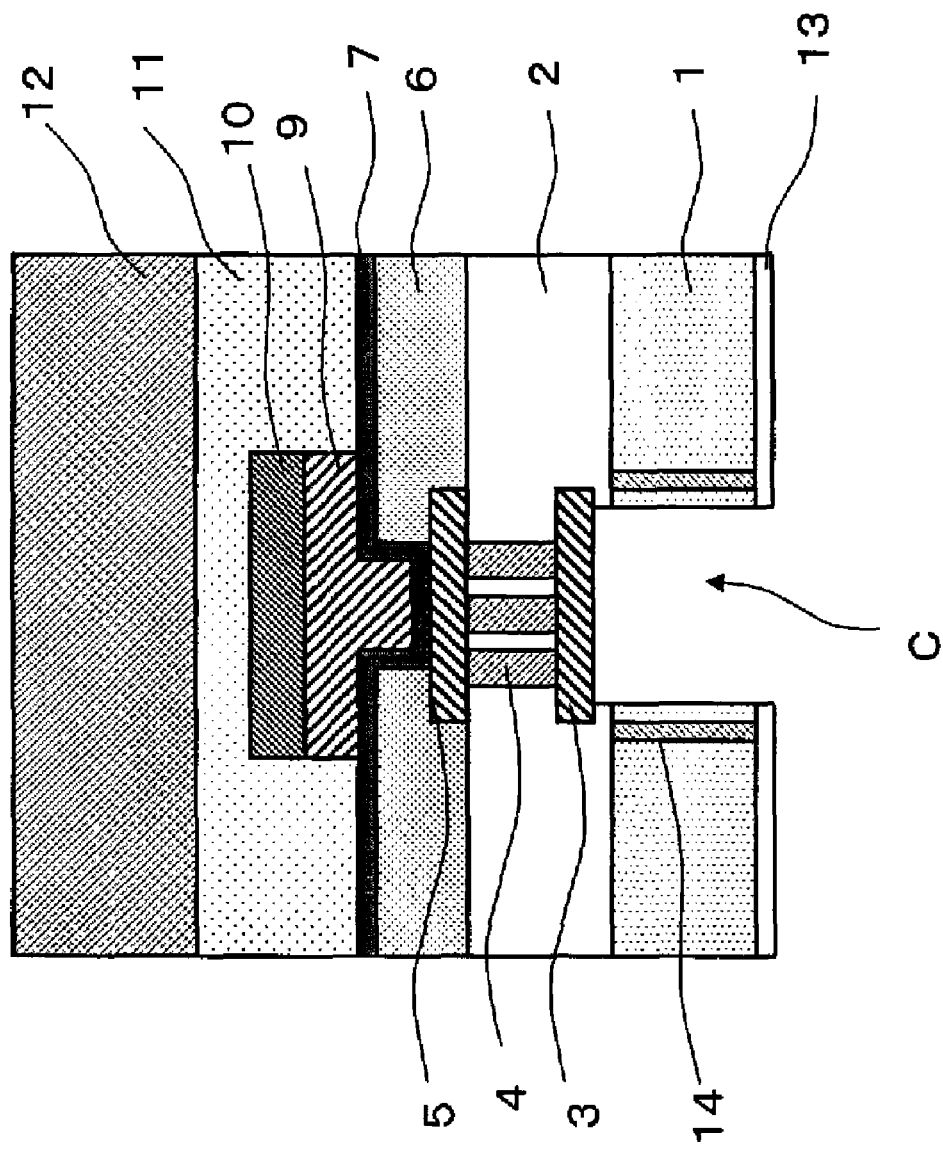
FIG. 5 is a diagram illustrating one step in one example of a method for manufacturing a semiconductor device of the present invention.

Next, as illustrated in FIG. 5, insulating film 13 made of silicon nitride or the like is formed so as to cover the rear surface side of semiconductor substrate 1. Second opening C is formed within a region surrounded by trench 14 by means of dry etching, thereby exposing the rear surface of first interconnect layer 3.

Figure 6:
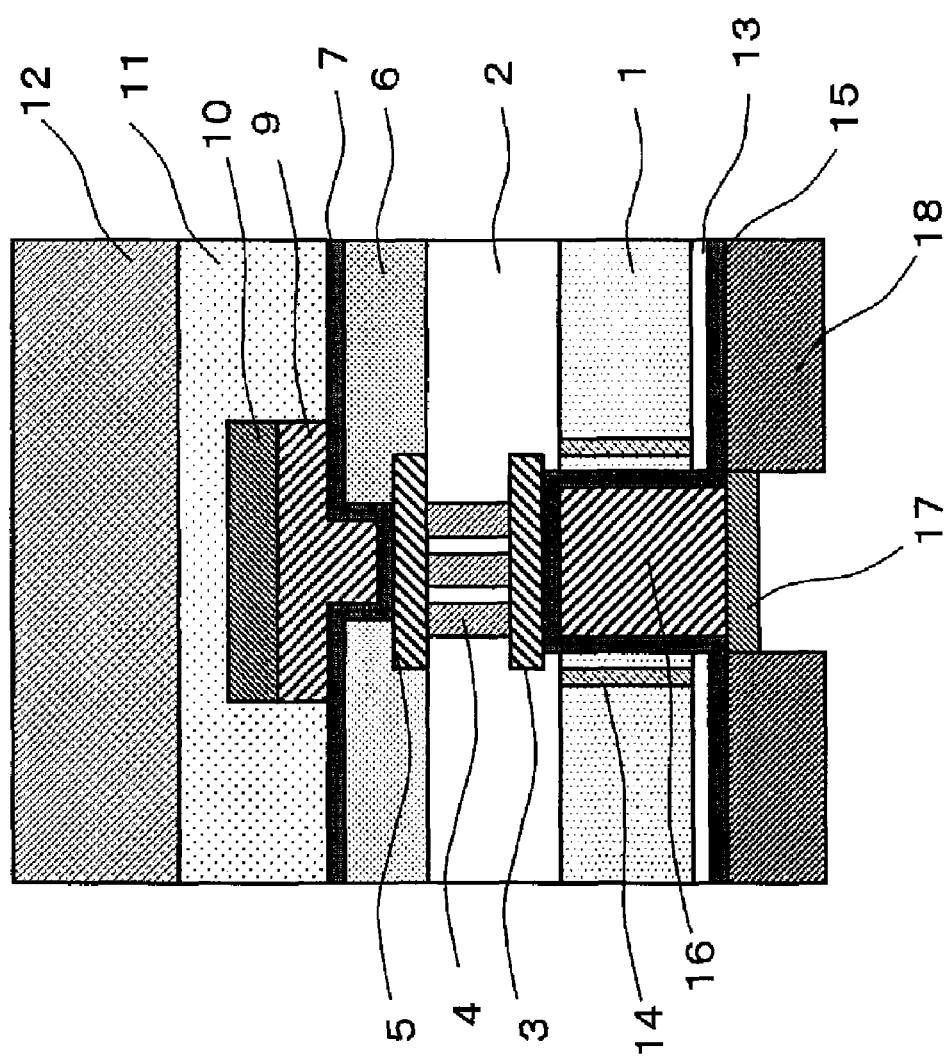
FIG. 6 is a diagram illustrating one step in one example of a method for manufacturing a semiconductor device of the present invention.

Next, as illustrated in FIG. 6, metal seed film 13 for the purpose of electrolytic plating is formed using a laminated film (film thickness: approximately 700 to 800 nm) in which a titanium film and a copper film are successively laminated using a sputtering method.

A mask pattern is formed using resist film 18, so as to expose second opening C. As resist film 18, a film-type resist film in which an opening is created using a photolithographic technique can be used.

Using an electrolytic plating method, copper plug 16 (corresponds to a second projecting electrode) is formed so as to fill second opening C. The height of copper plug 16 is set so as to be substantially level with the rear surface of semiconductor substrate 1. Subsequently, Ni—Au laminated film 17 in which an approximately 2 to 3 μm-thick film of nickel (Ni) and an approximately 0.1 μm-thick film of gold (Au) are successively deposited is formed on an exposed surface of copper plug 16 on the rear surface side thereof using an electrolytic plating method. The outermost surface of a film to be provided on the exposed surface of copper plug 16 has only to be made of Au. In addition, a film interposed between the Au film and the copper plug may be a metal film other than an Ni film. For example, a film made of palladium (Pd) or silver (Ag), or an alloy film containing any metal selected from the group consisting of Ni, Pd and Ag, can also be used.

Figure 7:
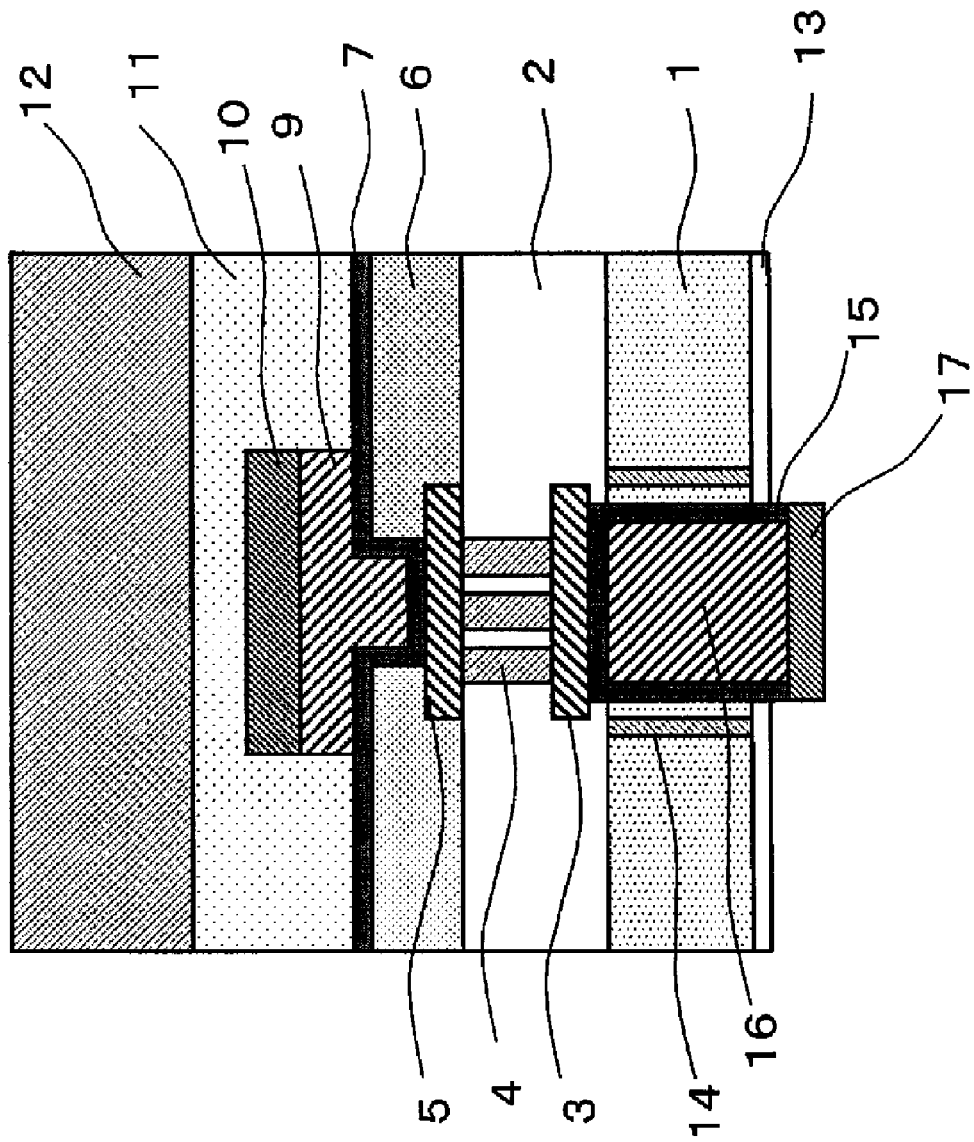
FIG. 7 is a diagram illustrating one step in one example of a method for manufacturing a semiconductor device of the present invention.

After the removal of resist film 18, the copper film part (upper-layer part) of metal seed film 15 is removed using a chemical solution containing sulfuric acid ($H_2SO_4$) and nitric acid ($HNO_3$). A titanium film (lower-layer part) in which metal seed film 15 remains is removed by further using a chemical solution containing potassium hydroxide (KOH) (FIG. 7). Since almost no amount of protrusion of copper plug 16 from semiconductor substrate 1 is present on the rear surface side, side etching is prevented from taking place in copper plug 16 at the time of removing metal seed film 15.

Figure 8:
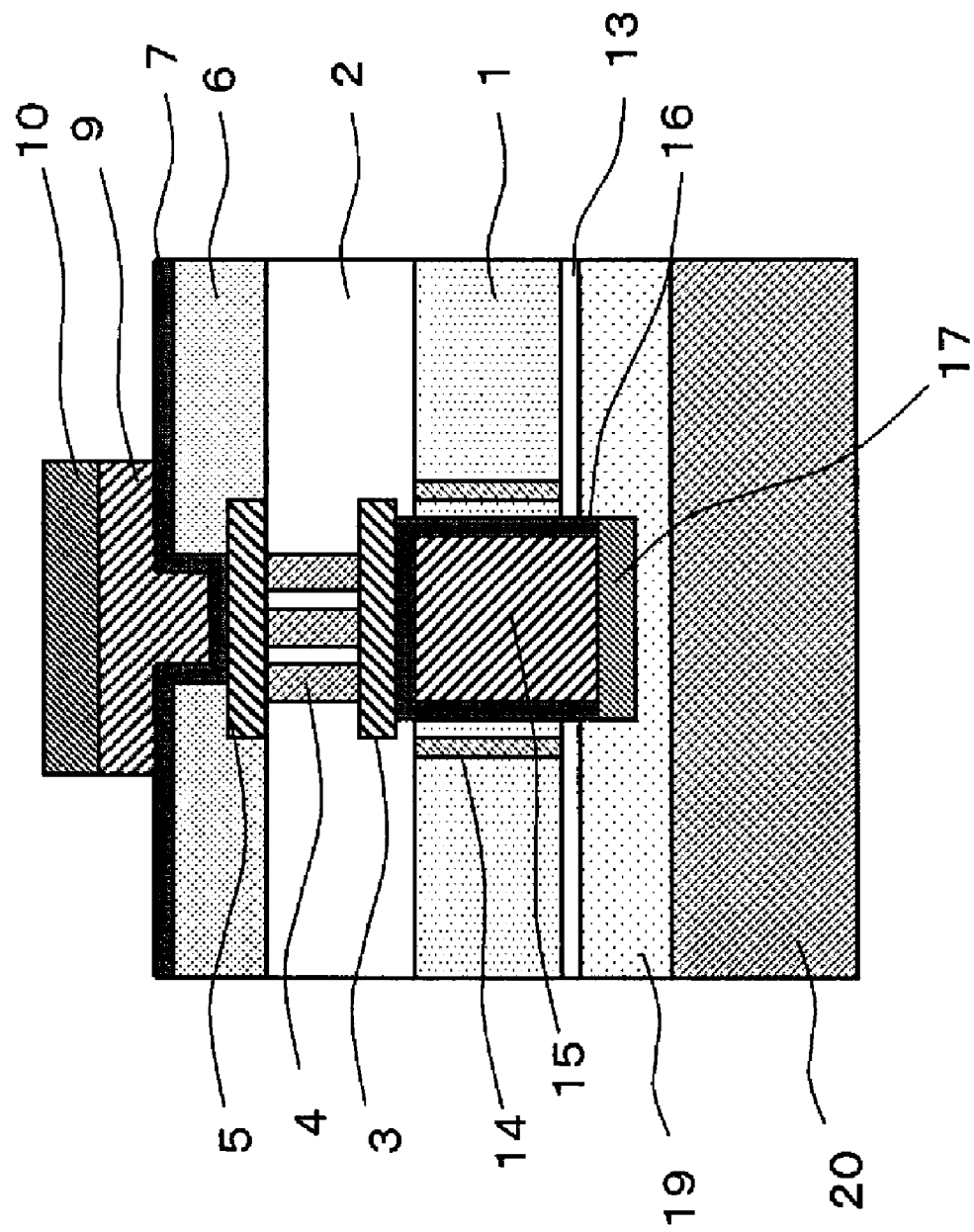
FIG. 8 is a diagram illustrating one step in one example of a method for manufacturing a semiconductor device of the present invention.

Second supporting substrate (support plate) 20 is bonded onto the rear surface side of semiconductor substrate 1 through second adhesion layer 19. As second supporting substrate 20, a transparent glass substrate or a hard resin substrate can be used. Subsequently, ultraviolet light is irradiated from the front surface side of the semiconductor substrate to reduce the adhesive strength of first adhesion layer 11 on the front surface side. After that, first supporting substrate 12 on the front surface side is removed (FIG. 8).

In the present exemplary embodiment, any overhanging shapes are not formed in first projecting electrode 9 on the front surface side at the time of removing first supporting substrate 12. Consequently, it is possible to prevent first projecting electrode 9 from dropping off along with first supporting substrate 12 at the time of removing first supporting substrate 12 on the front surface side. Thus, the manufacturing yield of semiconductor devices can be prevented from degrading.

Figure 9:
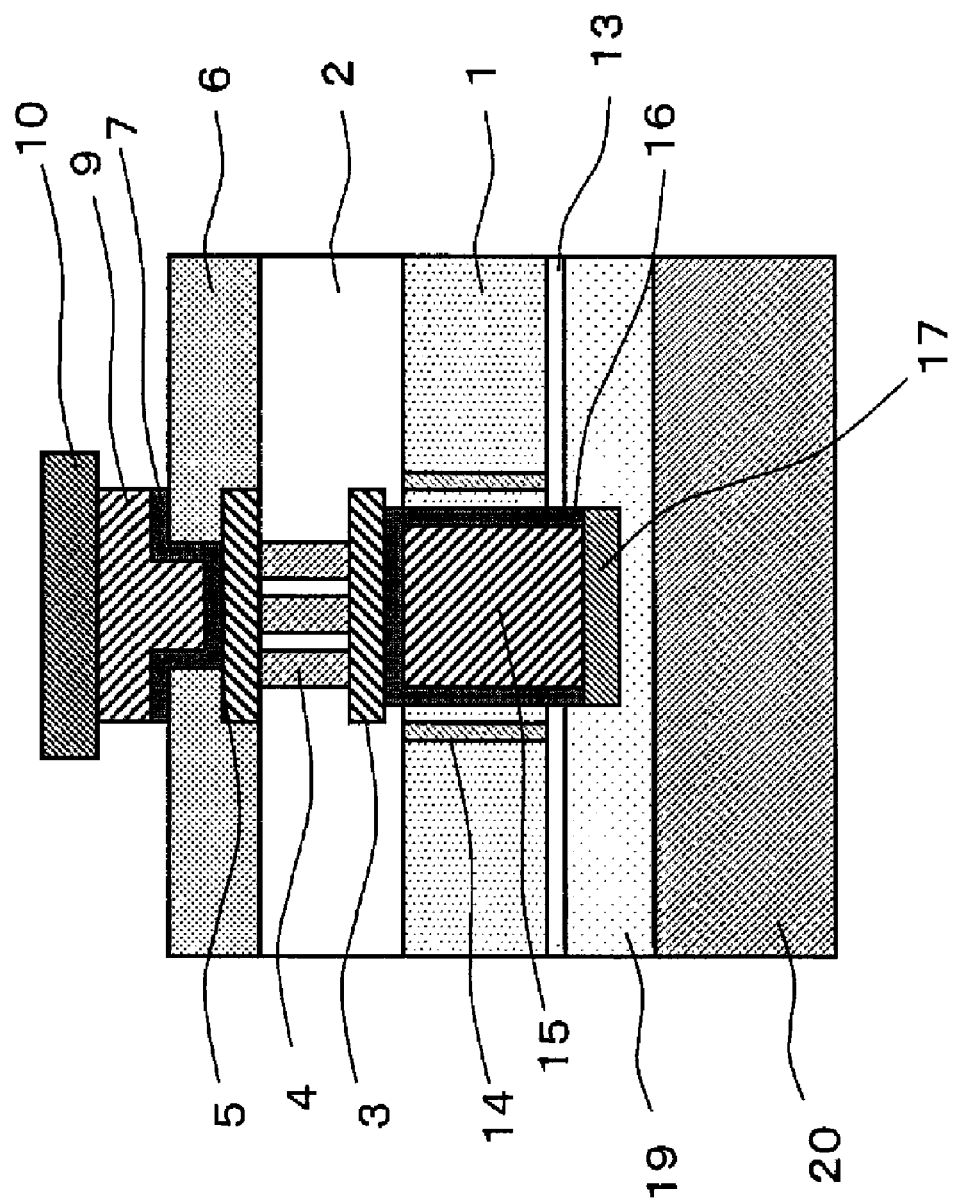
FIG. 9 is a diagram illustrating one step in one example of a method for manufacturing a semiconductor device of the present invention.

Next, the copper film part (upper-layer part) of metal seed film 7 on the front surface side is removed using a chemical solution containing sulfuric acid ($H_2SO_4$) and nitric acid ($HNO_3$). A titanium film (lower-layer part) in which metal seed film 7 remains is removed by further using a chemical solution containing potassium hydroxide (KOH) (FIG. 9). At this time, an overhanging shape is formed in first projecting electrode 9.

Figure 10:
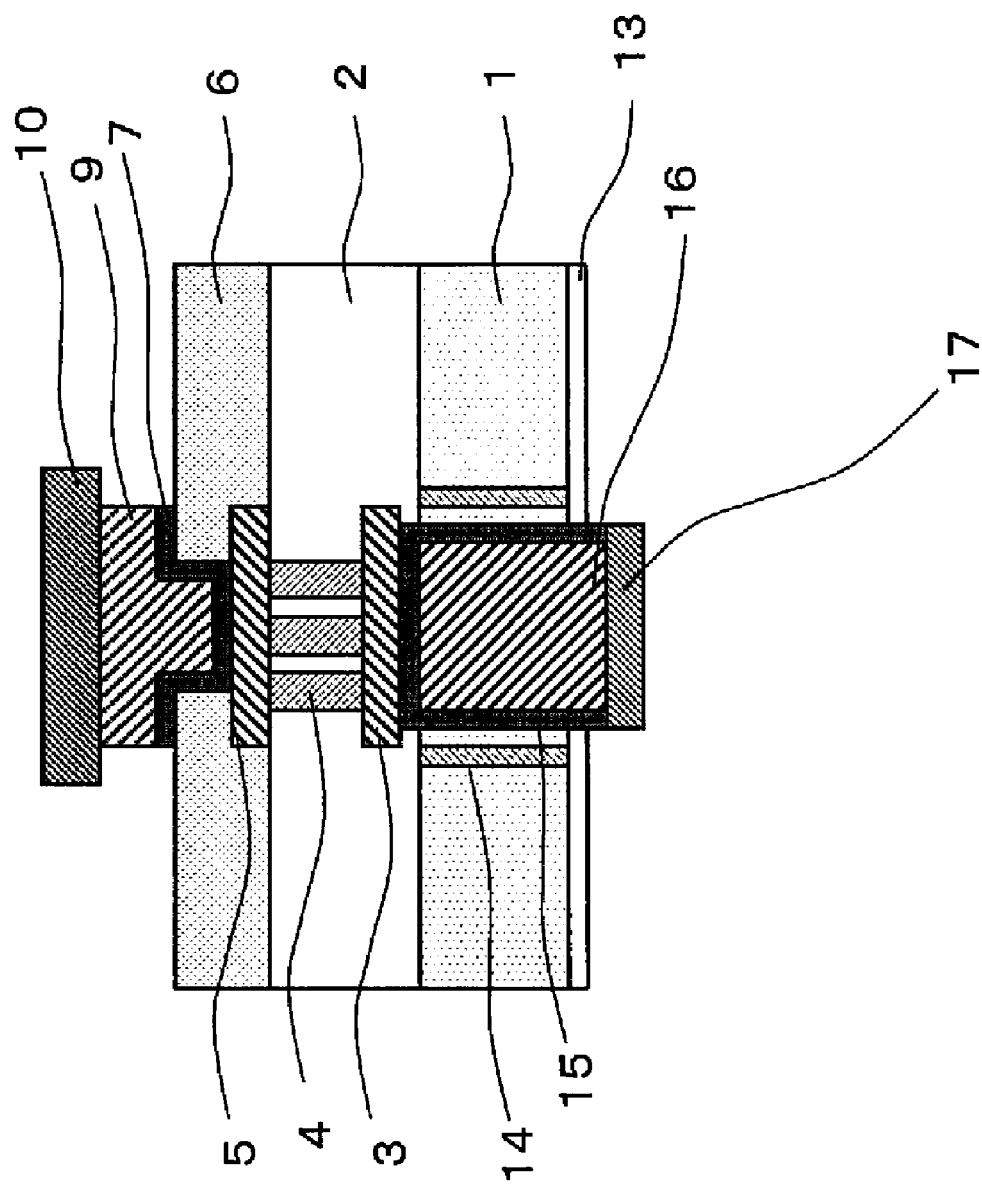
FIG. 10 is a diagram illustrating one step in one example of a method for manufacturing a semiconductor device of the present invention.

Ultraviolet light is irradiated from the rear surface side of the semiconductor substrate to reduce the adhesive strength of second adhesion layer 19 on the rear surface side. After that, second supporting substrate 20 on the rear surface side is removed. This completes a through-hole electrode (FIG. 10). This through-hole electrode includes first projecting electrode 9, metal seed film 7, second interconnect layer 5, contact plug 4, first interconnect layer 3, metal seed film 15, and copper plug 16. Sn—Ag alloy film 10 and Ni—Au laminated film 17 are respectively provided at one and the other ends of the through-hole electrode. Sn—Ag alloy film 10 corresponds to a first metal film and Ni—Au laminated film 17 corresponds to a second metal film.

Next, a method for stacking semiconductor chips provided with through-hole electrodes will be described. A semiconductor substrate in which through-hole electrodes are formed is diced into individual semiconductor chips.

Figure 11:
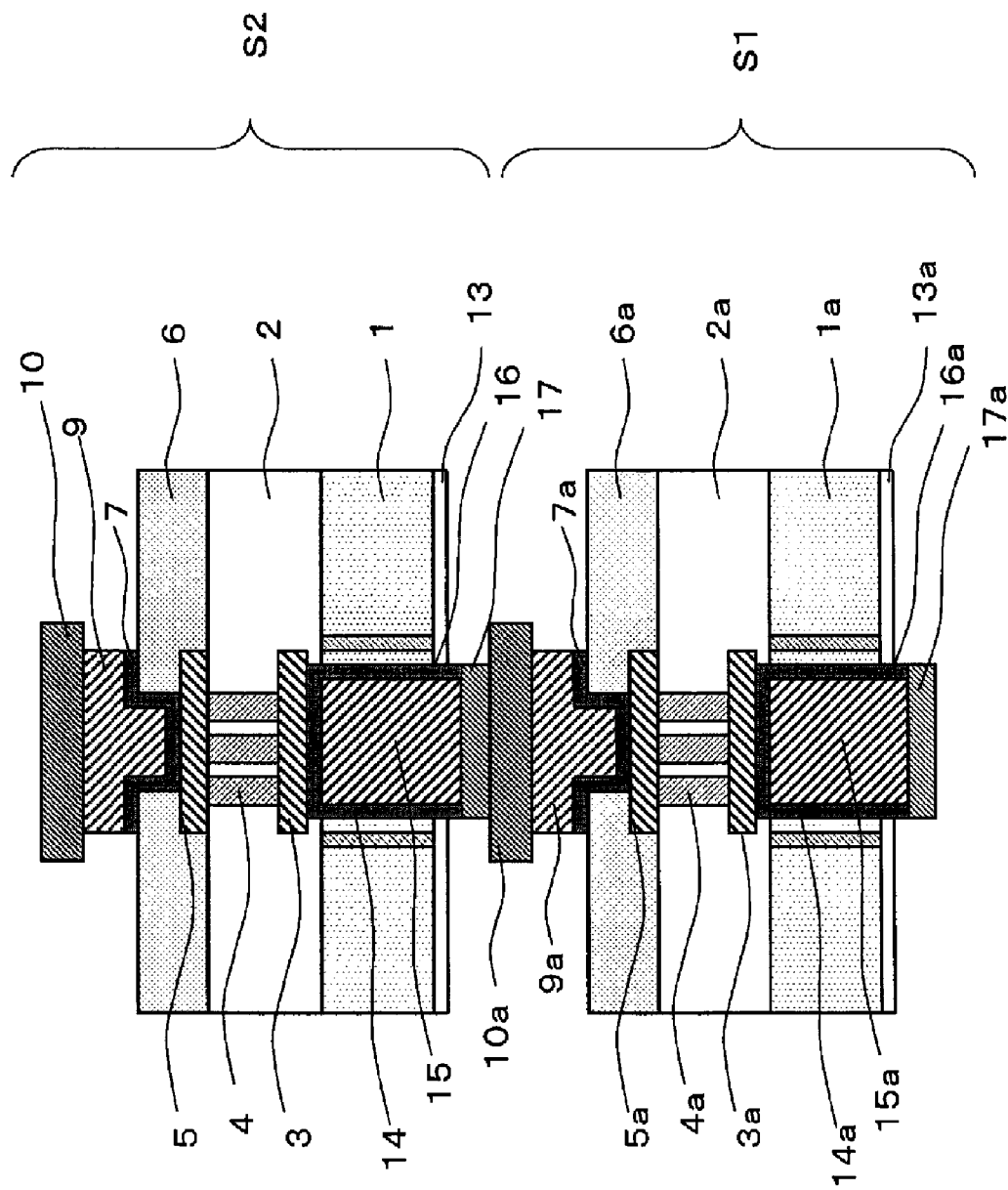
FIG. 11 is a diagram illustrating one step in one example of a method for manufacturing a semiconductor device of the present invention.

FIG. 11 illustrates semiconductor chips (S1 and S2) manufactured using the same method as described above and provided with through-hole electrodes of the same structure. The through-hole electrodes of semiconductor chips (S1 and S2) are joined to each other. In FIG. 11, reference numerals given to semiconductor chip S1 positioned downward are suffixed with "a". Reference numerals 1a, 2a, 3a, and 4a are semiconductor substrate, interlayer insulating film, first interconnect layer, and contact plug, respectively. Reference numerals 5a, 6a, 7a, and 9a are second interconnect layer, protective film, metal seed film, and first projecting electrode, respectively. Reference numerals 13a, 14a, 15a, 16a, and 17a are insulating film, trench, metal seed film, copper plug, and Ni—Au laminated film, respectively.

Ni—Au laminated film 17 on the rear surface side of semiconductor chip S2 and Sn—Ag alloy film 10a on the front surface side of semiconductor chip S1 are aligned with each other. Then, a temperature of approximately 250 to 300° C. is applied to reflow Sn—Ag alloy film 10a, while pressing the semiconductor chips against each other at a constant pressure, thereby forming an Au—Sn alloy (eutectic bonding layer) and joining the through-hole electrodes to each other. The pressure (load) applied at the time of junction may be set so as to be, for example, approximately 10 to 150 g per projecting electrode. The heating temperature may be at least a temperature at which an Sn—Au eutectic bond is formed. In addition, heating means may be selected from options, including use of a reflow furnace or an oven, heat radiation by a halogen lamp, and contact with a heated body, and is not limited in particular.

The composition ratio of a finally formed Au—Sn alloy may be set so as to be optimum in consideration of mechanical strength, electrical resistance, melting point, and the like. In one example, a melting point is approximately 278° C. if an alloy having a composition ratio of Au:Sn=8:2 is formed. Accordingly, it is possible to prevent a joined part between the through-hole electrodes from melting by performing heating at the time of mounting a semiconductor device after the completion of a stacking process on a printed-circuit board at a temperature lower than this melting point.

Prior to aligning semiconductor chips S2 and S1 with each other, a process may be carried out in which a hydrogen plasma treatment is performed on an exposed surface of Sn—Ag alloy film 10a on the front surface side of semiconductor chip S1 to remove a natural oxide film on the exposed surface and obtain a clean surface. This process can increase the junction strength of the through-hole electrodes.

When the through-hole electrodes are joined to each other, ultrasonic waves may also be applied to a junction interface by way of the through-hole electrodes, in addition to applying a pressure. As the ultrasonic waves, oscillating waves having a frequency of 50 to 70 kHz, for example, can be used. When applying ultrasonic waves, a pressure (load) to be applied between the through-hole electrodes may be set so as to be lower than that applied in the above-described specific example.

Furthermore, when ultrasonic waves are applied, a weak metal junction layer is formed in a contact interface between Au and Sn due to oscillation, even if heating is not performed concurrently. Accordingly, only ultrasonic waves may be applied first to temporarily fix the through-hole electrodes to each other without performing heating. Then, only heating may be performed using a reflow furnace or the like, thereby forming a strong junction.

Figure 16:
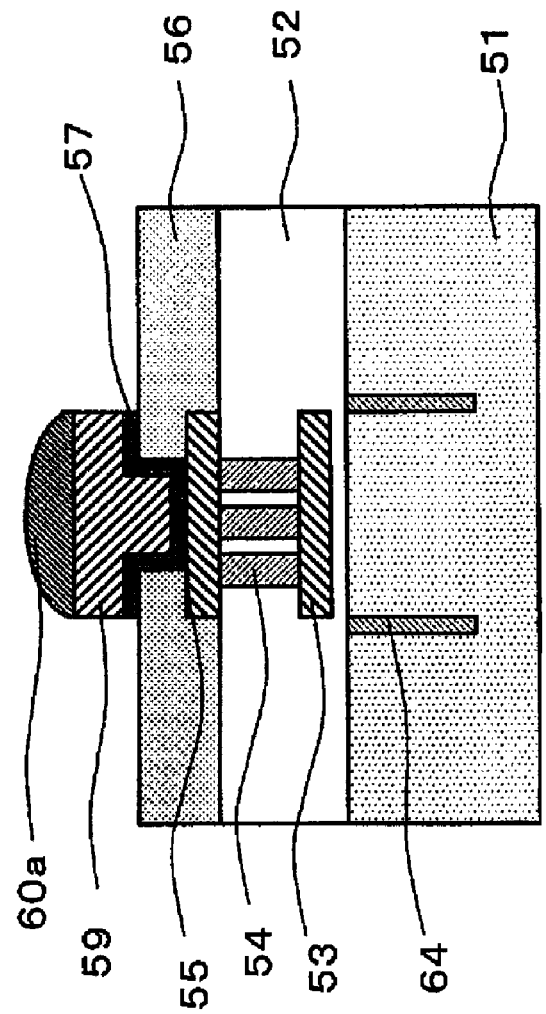
FIG. 16 is a diagram illustrating one step in a method for manufacturing a related semiconductor device.

In the present exemplary embodiment, an exposed part of metal seed film 7 is removed, and then the respective through-hole electrodes of the semiconductor chips are joined to each other with the overhanging shapes of first projecting electrodes 9 and 9a left. Consequently, there is no need to perform high-temperature reflow on an alloy film coated on each first projecting electrode, in order to eliminate the overhanging shapes, like the method for stacking semiconductor chips illustrated in FIG. 16. In addition, high-temperature reflow has only to be performed once on the through-hole electrodes at the time of stacking the semiconductor chips. Thus, a strong junction can be formed between the through-hole electrodes of the semiconductor chips to be stacked. As a result, it is possible to manufacture a high-reliability (durability) semiconductor device.

In addition, at the time of forming the through-hole electrodes, the first projecting electrode to be provided above the front surface of the semiconductor substrate can be prevented from dropping off during a manufacturing process. Thus, it is possible to prevent the manufacturing yield of semiconductor devices form degrading.

Second Exemplary Embodiment

The present exemplary embodiment relates to a method for manufacturing a semiconductor device in which three or more semiconductor chips are stacked. In the present exemplary embodiment, each semiconductor chip is manufactured in the same way as in the first exemplary embodiment. However, the present exemplary embodiment differs from the first exemplary embodiment in a process of stacking each semiconductor chip. Hereinafter, a method for manufacturing a semiconductor device in which three semiconductor chips are stacked will be described by way of example.

When three semiconductor chips are stacked, low-temperature (approximately 150 to 170° C.) heating is previously performed and through-hole electrodes are temporarily fixed to one another. This process is repeated until all semiconductor chips are stacked. Then, heating is performed finally at a temperature of approximately 250 to 300° C., thereby completely reflowing the Sn—Ag alloy films of all through-hole electrodes and forming an Au—Sn alloy. Thus, the through-hole electrodes can be completely fixed.

The temperature of approximately 150 to 170° C. applied first does not cause the Sn—Ag alloy films to be completely reflowed. Therefore, junction strength does not decrease at the time of subsequent high-temperature reflow.

Figure 12:
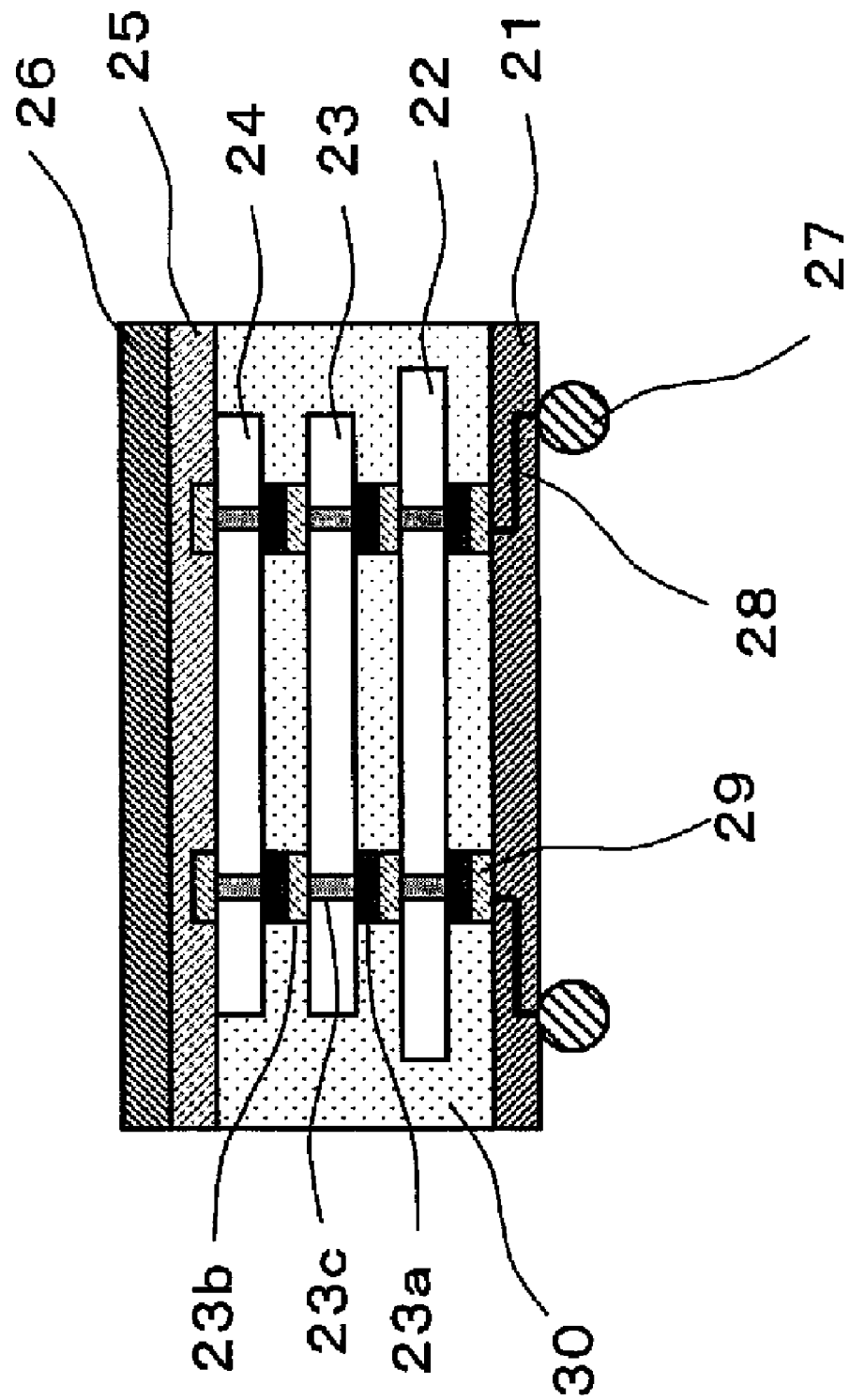
FIG. 12 is a diagram illustrating one step in one example of a method for manufacturing a semiconductor device of the present invention.
Figure 13:
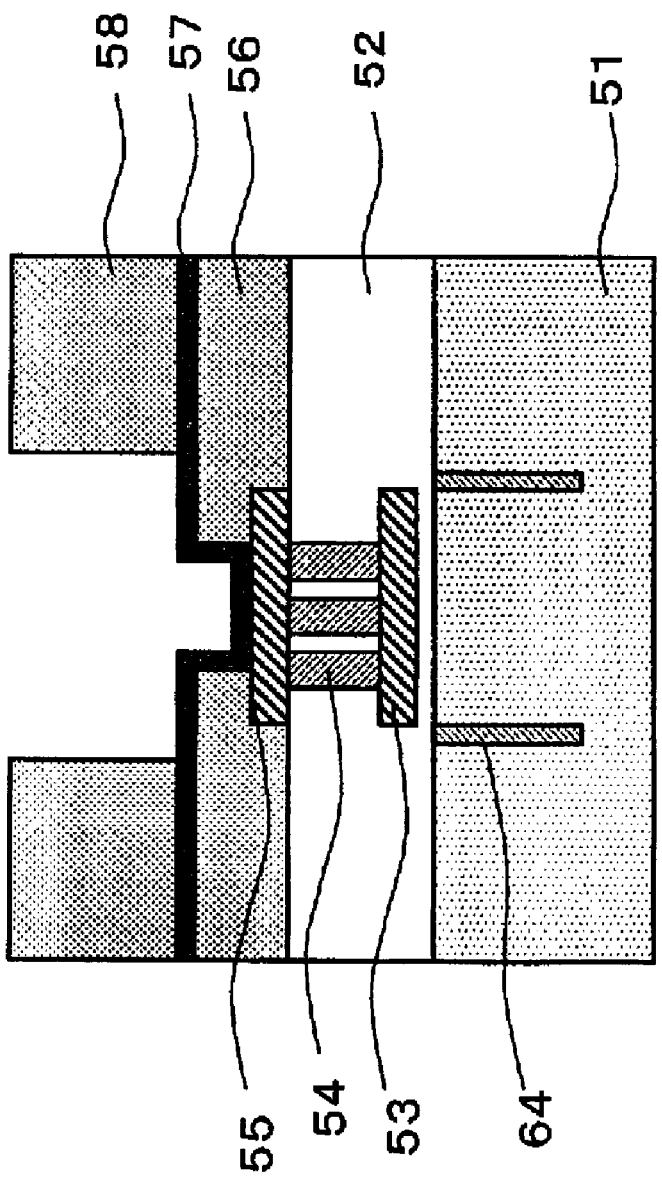
FIG. 13 is a diagram illustrating one step in a method for manufacturing a related semiconductor device.
Figure 14:
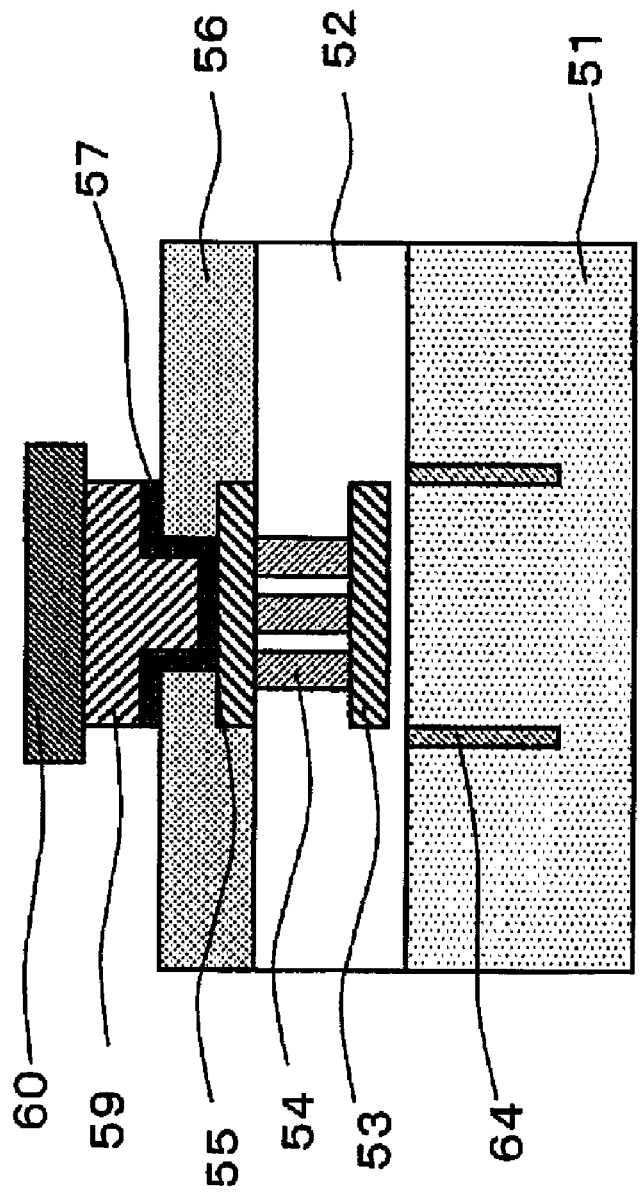
FIG. 14 is a diagram illustrating one step in a method for manufacturing a related semiconductor device.
Figure 15:
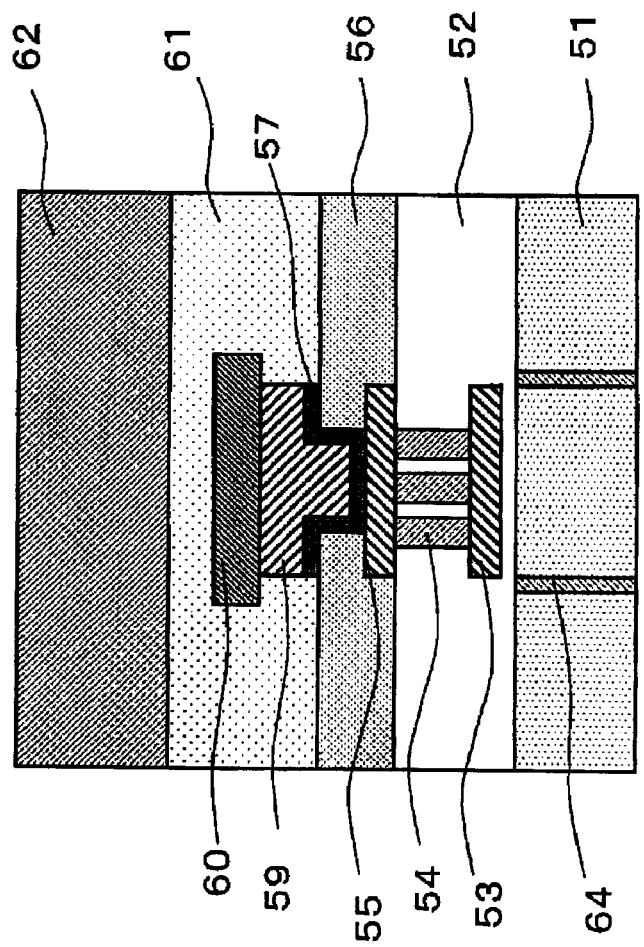
FIG. 15 is a diagram illustrating one step in a method for manufacturing a related semiconductor device.

As a specific example, a package of a highly-integrated DRAM formed by stacking three semiconductor chips will be described with reference to FIG. 12. A specific structure of each through-hole electrode is as explained earlier and is, therefore, not shown in FIG. 12.

Semiconductor chips 23 and 24 are the core chips of the DRAM and are composed mainly of memory cell circuits. Semiconductor chip 22 is an interface chip and is formed using a logic circuit for controlling data input to/output from the core chips (23 and 24). The respective semiconductor chips are divided into individual pieces by means of dicing after the formation of through-hole electrodes. The semiconductor chips to be stacked have only to be the same in the arrangement of through-hole electrodes and may be different in size.

Semiconductor chips 22, 23 and 24 include through-hole electrodes of the same structure. By way of illustration, semiconductor chip 23 includes Ni—Au laminated film 23a on the rear surface side of the chip, through-hole electrode 23c, and Sn—Ag alloy film 23b on the front surface side of the chip. A surface including a Cu projecting electrode on the front surface side of semiconductor chip 24 in the uppermost layer is fixed to metal lead frame 26 by attach film 25.

The through-hole electrodes of the three semiconductor chips are aligned with one another and temporarily fixed to one another by means of low-temperature (approximately 150 to 170° C.) heating. This process is repeated to successively stack the three semiconductor chips. At this time, semiconductor chip 24 in the uppermost layer and lead frame 26 are initially fixed to each other. The subassembly thus obtained can be used as a base when each chip is successively stacked. When the through-hole electrodes are temporarily fixed to one another, ultrasonic waves may be applied to junction interfaces by way of the through-hole electrodes. In addition, ultrasonic waves may also be applied to the junction interfaces of the through-hole electrodes when high-temperature reflow is performed. As the ultrasonic waves, oscillating waves having a frequency of 50 to 70 kHz, for example, can be used. When applying ultrasonic waves, a pressure (load) to be applied between through-hole electrodes may be set so as to be lower than that applied in the above-described specific example.

After all of the semiconductor chips are stacked, the respective semiconductor chips are completely fixed by applying a temperature of approximately 250 to 300° C., while applying a constant pressure.

Reference numeral 21 denotes a base substrate, which is connected to semiconductor chip 22 through terminal 29. Resin 30 is filled among semiconductor chips to protect each semiconductor chip. Base substrate 21 is provided with a plurality of solder balls 27 and solder balls 27 are connected to the through-hole electrode of the interface chip (22) through interconnect layer 28 and terminal 29. External input-output signals, a power supply voltage, and the like are applied to solder balls 27.

In the present exemplary embodiment, junctions are formed among the through-hole electrodes of the respective semiconductor chips with overhanging shapes left for the first projecting electrodes. Accordingly, there is no need to perform high-temperature reflow on an alloy film coated on each first projecting electrode, in order to eliminate the overhanging shapes. In addition, when the semiconductor chips are stacked, low-temperature reflow for the purpose of temporary fixation is performed on the through-hole electrodes a plurality of times and high-temperature reflow for the purpose of complete fixation is performed thereon once. This reflow for temporary fixation is performed at a low temperature, rather than a high temperature (approximately 250 to 300° C.) at which an Sn—Ag alloy film is completely reflowed. Consequently, the through-hole electrodes of the semiconductor chips to be stacked can be strongly joined to one another. As a result, it is possible to manufacture a high-reliability (durability) semiconductor device.

In addition, at the time of forming the through-hole electrodes, each first projecting electrode to be provided above the front surface of each semiconductor substrate can be prevented from dropping off during a manufacturing process. Thus, it is possible to prevent the manufacturing yield of semiconductor devices from degrading.

In the present exemplary embodiment, an example has been shown in which three semiconductor chips are stacked. Alternatively, however, the number of semiconductor chips to be stacked may be four or greater.

It is apparent that the present invention is not limited to the above embodiments, but may be modified and changed without departing from the scope and spirit of the invention.

What is claimed is:
1. A method for manufacturing a semiconductor device, comprising:

preparing a substrate including a plurality of chips, each of the chips comprising an interconnect structure therein, and the substrate including a first surface and a second surface opposite to the first surface;

forming a first opening from the first surface of the substrate toward a thickness direction thereof, so as to expose the interconnect structure;

forming a seed film on the first surface of the substrate;

forming a first projecting electrode, so that the first projecting electrode is buried inside the first opening in which the seed film is provided and protrudes outward from the first surface of the substrate;

forming a first metal film on an outside top surface of the first projecting electrode;

attaching a first supporting substrate to the first surface of the substrate with a first adhesion layer interposed therebetween;

forming a second opening from the second surface of the substrate toward the thickness direction thereof, so as to expose the interconnect structure;

forming a second projecting electrode, so that the second projecting electrode is buried inside the second opening and protrudes outward from the second surface of the substrate;

forming a second metal film on an outside top surface of the second projecting electrode;

attaching a second supporting substrate to the second surface of the substrate with a second adhesion layer interposed therebetween;

removing the first supporting substrate and the first adhesion layer;

removing an exposed part of the seed film provided on the first surface;

removing the second supporting substrate and the second adhesion layer; and cutting the substrate into the plurality of chips, each of the chips being provided with a through-hole electrode including the first projecting electrode, the seed film inside the first opening, the interconnect structure, and the second projecting electrode.

2. The method for manufacturing a semiconductor device according to claim 1, further comprising:

stacking the plurality of chips after cutting the substrate, so that the first metal film and the second metal film provided in different chips have contact with each other; and performing a first reflow to join the through-hole electrodes of respective chips to each other.

3. The method for manufacturing a semiconductor device according to claim 2, wherein the first reflow is performed at a temperature at which an eutectic bonding is formed by metals contained in the first metal film and the second metal film.

4. The method for manufacturing a semiconductor device according to claim 2, wherein in cutting the substrate, three or more chips including the through-hole electrodes are provided, and in stacking the plurality of chips, the three or more chips are temporarily fixed to one another, by repeating a process of stacking one chip on another chip, so that the second metal film of one chip and the first metal film of the another chip have contact with each other and then performing a second reflow at a temperature lower than the temperature of the first reflow.

5. The method for manufacturing a semiconductor device according to claim 4, wherein the second reflow is performed at a temperature lower than a temperature at which a eutectic bonding is formed by metals contained in the first metal film and the second metal film.

6. The method for manufacturing a semiconductor device according to claim 4, wherein the second reflow is performed at a temperature of 150 to 170° C.

7. The method for manufacturing a semiconductor device according to claim 2, wherein the first reflow is performed at a temperature of 250 to 300° C.

8. The method for manufacturing a semiconductor device according to claim 2, wherein performing the first reflow further includes applying ultrasonic oscillation to a junction between the first metal film and the second metal film.

9. The method for manufacturing a semiconductor device according to claim 2, further comprising performing a plasma treatment on the first metal film of each chip, between cutting the substrate and stacking the plurality of chips.

10. The method for manufacturing a semiconductor device according to claim 2, wherein in performing the first reflow, an Au—Sn alloy film is formed between the first metal film and the second metal film by the first reflow.

11. The method for manufacturing a semiconductor device according to claim 2, wherein at least one chip, among the stacked plurality of chips, includes a DRAM (Dynamic Random Access Memory) chip.

12. The method for manufacturing a semiconductor device according to claim 1, further comprising:

stacking the plurality of chips after cutting the substrate, so that the first metal film and the second metal film provided in different chips have contact with each other; and fixing the plurality of chips temporally to each other without performing reflow.

13. The method for manufacturing a semiconductor device according to claim 12, wherein fixing the plurality of chips temporally to each other includes applying ultrasonic oscillation to a junction between the first metal film and the second metal film.

14. The method for manufacturing a semiconductor device according to claim 1, wherein the first metal film is an Sn—Ag alloy film.

15. The method for manufacturing a semiconductor device according to claim 1, wherein the second metal film includes a laminated film made of a third metal film provided on the second projecting electrode and Au film deposited on the third metal film.

16. The method for manufacturing a semiconductor device according to claim 15, wherein the third metal film is at least metal film selected from a group consisting of a Ni film, a Pd film, a Ag film, and an alloy film containing any of Ni, Pd, and Ag.

17. A method for manufacturing a semiconductor device, comprising:

forming a semiconductor chip in a semiconductor substrate including a first surface and a second surface opposite to the first surface;

forming a first projecting electrode, in which a first metal film is provided as an outermost layer, over the first surface of the semiconductor chip;

attaching a first supporting substrate to the first surface of the semiconductor substrate;

forming an electrode part to be electrically connected to the first projecting electrode from the second surface side;

forming a second projecting electrode, in which a second metal film is provided as an outermost layer, on an edge exposed on the second surface side of the electrode part;

attaching a second supporting substrate to the second surface of the semiconductor substrate with a second adhesion layer interposed therebetween;

removing the first supporting substrate;

removing the second supporting substrate and the second adhesion layer;

cutting the semiconductor substrate into the plurality of chips; and reflowing the first metal film by heating the semiconductor substrate after removing the second supporting substrate.

18. The method for manufacturing a semiconductor device according to claim 17, further comprising:

performing grinding from the second surface of the semiconductor substrate to thin the semiconductor substrate to a predetermined thickness, between attaching the first supporting substrate and forming the electrode part.

19. The method for manufacturing a semiconductor device according to claim 18, further comprising preparing another semiconductor chip including the second projecting electrode in which the second metal film is provided as an outermost layer, wherein in reflowing the first metal film, an alloy film containing metals composing the first and second metal films is formed, between the first projecting electrode of the semiconductor chip and the second projecting electrode of the another semiconductor chip.

20. The method for manufacturing a semiconductor device according to claim 19, wherein the alloy film containing metals composing the first and second metal films is an Au—Sn alloy film.

21. A method for manufacturing a semiconductor device, comprising:

forming a seed film over a first surface of a semiconductor substrate, the semiconductor substrate including a second surface opposite to the first surface;

selectively forming a first electrode on the seed film, the seed film thereby including a portion uncovered with the first electrode;

attaching a first supporting substrate to cover the first electrode and the portion of the seed film;

forming a second electrode over the second surface of the semiconductor substrate while keeping the first supporting substrate attached, the second electrode being electrically connected to the first electrode;

removing the first supporting substrate; and removing the portion of the seed film.

22. The method according to claim 21, further comprising: attaching a second supporting substrate to cover the second electrode before removing the first supporting substrate.

* * * * *